United States Patent
Qi et al.

(10) Patent No.: US 10,389,414 B1
(45) Date of Patent: Aug. 20, 2019

(54) METHODS AND APPARATUS FOR MATRIX COMPENSATION TO PREVENT RANK DEFICIENCY

(71) Applicant: Marvell International Ltd., Hamilton (BM)

(72) Inventors: Yihong Qi, Santa Clara, CA (US); Xiayu Zheng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 59 days.

(21) Appl. No.: 15/672,117

(22) Filed: Aug. 8, 2017

Related U.S. Application Data

(60) Provisional application No. 62/378,893, filed on Aug. 24, 2016.

(51) Int. Cl.
| | |
|---|---|
| *H04B 7/0413* | (2017.01) |
| *H03M 13/00* | (2006.01) |
| *H03M 13/11* | (2006.01) |
| *G06F 15/78* | (2006.01) |
| *H02J 50/50* | (2016.01) |

(52) U.S. Cl.
CPC ...... *H04B 7/0413* (2013.01); *H03M 13/1148* (2013.01); *H03M 13/616* (2013.01); *G06F 15/7839* (2013.01); *H02J 50/50* (2016.02)

(58) Field of Classification Search
CPC .. H04B 7/0413; H04B 7/0421; H04B 7/0617; H04B 7/0626; H04B 7/0634; H04B 7/0639
See application file for complete search history.

(56) References Cited

U.S. PATENT DOCUMENTS

| | | | |
|---|---|---|---|
| 7,242,720 B2 | 7/2007 | Sugiyama et al. | |
| 7,826,337 B2 | 11/2010 | Shi et al. | |
| 8,995,543 B2 | 3/2015 | Fechtel et al. | |
| 9,209,873 B1 | 12/2015 | Zhang et al. | |
| 2006/0274691 A1 | 12/2006 | Naguib et al. | |
| 2007/0030914 A1 | 2/2007 | Ding et al. | |

(Continued)

OTHER PUBLICATIONS

"Amendment 4: Enhancements for Very High Throughput for Operation in Bands below 6 GHz", IEEE Std 802.11ac-2013, 2012, 425 pages.

(Continued)

*Primary Examiner* — Benjamin H Elliott, IV
*Assistant Examiner* — Prince A Mensah

(57) ABSTRACT

The present disclosure describes methods and apparatuses for matrix compensation to prevent rank deficiency. In some aspects, a channel matrix is formed based on channel feedback matrices that are received from multiple devices. The channel matrix is transformed to provide a channel covariance matrix, which is then decomposed into a unitary matrix and Eigen value matrix components. Diagonal values of the Eigen value matrix are increased to provide a compensated Eigen value matrix. Based on the compensated Eigen value matrix, a steering matrix is determined for steering transmissions through the channel to the multiple devices. By compensating the Eigen value matrix, rank deficiency issues that typically result in failed steering matrix calculations can be prevented. Alternately or additionally, a dynamic range of the steering matrix calculations may be reduced by compensating matrices, enabling steering matrices to be calculated with less-complex or fewer hardware resources.

20 Claims, 8 Drawing Sheets

(56) References Cited

U.S. PATENT DOCUMENTS

| | | | |
|---|---|---|---|
| 2007/0249296 A1* | 10/2007 | Howard | H04B 7/0421 |
| | | | 455/101 |
| 2009/0180404 A1 | 7/2009 | Jung et al. | |
| 2012/0288021 A1 | 11/2012 | Park et al. | |
| 2016/0234042 A9 | 8/2016 | De Victoria | |
| 2016/0285525 A1* | 9/2016 | Budianu | H04B 7/0417 |
| 2017/0214429 A1 | 7/2017 | Eistein et al. | |
| 2018/0270038 A1 | 9/2018 | Oteri et al. | |

OTHER PUBLICATIONS

"Amendment 5: Enhancements for Higher Throughput", 2007, 536.
"Pre-Interview Communication", U.S. Appl. No. 15/611,050, dated Aug. 10, 2018, 3 pages.
Bellalta, "IEEE 802.11ax: High-Efficiency WLANs", Accepted for publication in IEEE Wireless Communications Magazine. Jul. 2015, Jul. 2015, 16 pages.
Mu, et al., "U.S. Appl. No. 15/849,213, filed Dec. 20, 2017", 46 pages.
"First Action Interview Office Action", U.S. Appl. No. 15/611,050, dated Oct. 19, 2018, 3 pages.
"Pre-Interview Communication", U.S. Appl. No. 15/672,117, dated Jan. 15, 2019, 3 pages.
"Notice of Allowance", U.S. Appl. No. 15/611,050, dated Feb. 21, 2019, 5 pages.
"Notice of Allowance", U.S. Appl. No. 15/849,213, dated Apr. 10, 2019, 6 pages.
"Pre-Interview Communication", U.S. Appl. No. 15/849,213, dated Feb. 6, 2019, 3 pages.
"Pre-Interview Communication", U.S. Appl. No. 16/163,167, dated Jun. 25, 2019, 3 pages.

* cited by examiner

__(1)__

METHODS AND APPARATUS FOR MATRIX COMPENSATION TO PREVENT RANK DEFICIENCY

RELATED APPLICATIONS

This present disclosure claims priority to U.S. Provisional Patent Application Ser. No. 62/378,893 filed Aug. 24, 2016, the disclosure of which is incorporated by reference herein in its entirety.

BACKGROUND

Many computing and electronic devices access the Internet or other resources through wireless networks, which are typically provided and administered by an access point or base station. As data consumption levels of device users increase, device manufacturers and network architects continue to develop new generations of networking equipment and communication schemes capable of supporting higher levels of data consumption. For example, some devices and access points can communicate large amounts of data by using a multiple-input multiple-output (MIMO) scheme in which data is communicated through a channel via multiple transmit and multiple receive antennas.

Implementing these advanced communication schemes, however, often involves complex mathematical operations to encode data for transmission through a variety of channel conditions. In some cases, attempts to resolve mathematical parameters for disparate or saturated channels generate intermediate results that are not viable for encoding data for transmission. In such cases, the intermediate results are often discarded and another attempt is started to resolve the mathematical parameters of the channel. In addition to increased calculation times, discarding the intermediate results also wastes computational resources and power of a device, which can result in various performance issues. For example, in consumer devices that feature limited resources and rely heavily on streaming data, repetitive attempts at resolving the mathematical parameters of a channel may result in slower processing of multimedia data and impair user experience.

SUMMARY

This summary is provided to introduce subject matter that is further described in the Detailed Description and Drawings. Accordingly, this Summary should not be considered to describe essential features nor used to limit the scope of the claimed subject matter.

In some aspects, a method is described that receives channel feedback matrices from multiple remote devices. Based on the feedback matrices, a channel matrix is formed, which is then transformed to provide a channel covariance matrix. The method decomposes the channel covariance matrix into a unitary matrix and an Eigen value matrix. Diagonal values of the Eigen value matrix are increased to compensate the Eigen value matrix, which may be effective to prevent rank deficiency issues during subsequent matrix operations. The method then determines, based on the compensated Eigen value matrix, a steering matrix for steering transmissions through the channel to respective ones of the multiple remote devices.

In other aspects, an apparatus for wireless communication is described that includes a receiver to receive data via a wireless medium, a transmitter to transmit other data via the wireless medium, and a precoder to precode signals for transmission by the transmitter. The apparatus also includes a matrix compensator is configured to receive, from multiple remote devices, feedback matrices that describe conditions of a channel of the wireless medium. The matrix compensator forms, based the feedback matrices, a channel matrix that describes conditions of the channel and then generates a channel covariance matrix based on the channel matrix. The channel covariance matrix is then decomposed into a unitary matrix and an Eigen value matrix. The matrix compensator increases diagonal values of the Eigen value matrix to provide a compensated Eigen value matrix, which can be effective to prevent rank deficiency issues during subsequent operations. Based on the compensated Eigen value matrix, a steering matrix for steering transmissions to the multiple remote devices is determined. The precoder can then precode signals with the steering matrix to provide precoded signals for transmission to the multiple remote devices.

In yet other aspects, a System-on-Chip (SoC) is described that includes an interface for a wireless transceiver, a hardware-based processor, and a memory storing processor-executable instructions for implementing a matrix compensator. When implemented, the matrix compensator receives, from remote devices, feedback matrices that describe conditions of a channel. Based on the feedback matrices, the matrix compensator forms a channel matrix, which then used to generate a channel covariance matrix or beam matrix. The matrix compensator decomposes the channel covariance matrix into a unitary matrix and an Eigen value matrix, diagonal values of which are increased to compensate Eigen value matrix. A steering matrix for steering transmissions through the channel to the multiple remote devices is then generated based on the compensated Eigen value matrix.

The details of one or more implementations are set forth in the accompanying drawings and the following description. Other features and advantages will be apparent from the description and drawings, and from the claims.

BRIEF DESCRIPTION OF THE DRAWINGS

The details of one or more implementations of matrix compensation to prevent rank deficiency are set forth in the accompanying figures and the detailed description below. In the figures, the left-most digit of a reference number identifies the figure in which the reference number first appears. The use of the same reference numbers in different instances in the description and the figures indicates like elements.

DETAILED DESCRIPTION

Figure 1:
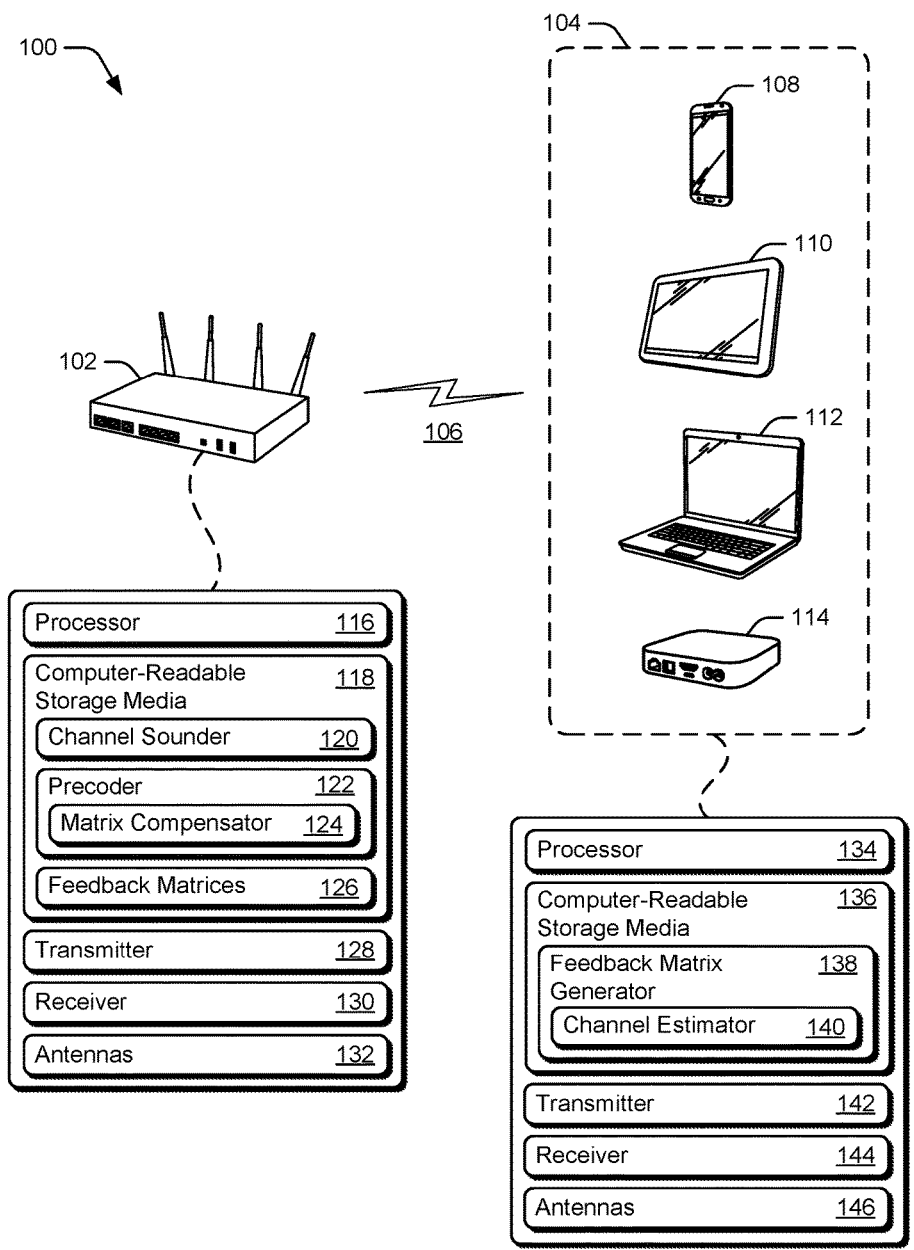
FIG. 1 illustrates an example operating environment having devices that are capable of wireless communication in accordance with one or more aspects.

Conventional techniques for beamforming streams of information often rely on computationally expensive and complex processes that may not provide viable matrix parameters for steering matrix generation. For example, when communicating with multiple devices, such as in a multi-user multiple-input multiple-output (MU-MIMO) environment, high utilization of available spatial streams typically results in complex matrix operations that are difficult to resolve. In particular, different respective channel conditions of each client device may lead to wide dynamic ranges of matrix values, which often exceed an available bit-width (e.g., bit precision) of fixed-point processors that are used for precoding beamformed transmissions. Accordingly, these complex matrix operations may result in rank deficiency issues wherein values of a matrix (e.g., Eigen value decomposition) vary to such an extent that inverse matrix and vector estimation operations become unreliable for steering matrix generation. These reliability issues often lead to discarding nonviable intermediate calculation results or producing unbalanced steering matrices, which degrades performance of the beamformer. Conventional solutions for rank deficiency may include increasing a bit-width or precision of a fixed-point processor to account for wide dynamic ranges of matrix calculation values. Such processors, however, are typically too expensive in terms of design space, hardware, and power to implement in small form factor devices.

This disclosure describes techniques and apparatuses for matrix compensation to prevent rank deficiency. In some aspects, a channel matrix is formed based on channel feedback matrices that are received from multiple devices. The channel matrix is transformed to provide a channel covariance matrix, which is then decomposed into a unitary matrix and Eigen value matrix components. Diagonal values of the Eigen value matrix are increased to provide a compensated Eigen value matrix. Based on the compensated Eigen value matrix, a steering matrix is determined for steering transmissions through the channel to the multiple devices. By compensating the Eigen value matrix, rank deficiency issues that typically result in unreliable or failed steering matrix calculations can be prevented. Alternately or additionally, a dynamic range of the steering matrix calculations may be reduced by the compensated matrix, enabling steering matrices to be calculated with less-complex or fewer hardware resources.

These and other aspects described herein may be performed to enable various beamforming operations in which transmissions of a host device (e.g., access point) are "steered" toward multiple receiving devices, such as in a MU-MIMO wireless network environment. For example, a MU-MIMO beamformer may be implemented with a zero forcing precoder that provides multiple stream vectors that each "zero out" interference with others of the multiple stream vectors through equalization. For equalization when receiving signals from different streams, zero forcing can be used to zero out the effects of the other streams in mathematical terms by finding a matrix inverse. In the context of a matrix that describes a channel of wireless medium, referred to as a channel matrix H, if an inverse of the channel matrix H can be determined, the result of multiplying the matrices is an identity matrix I. Each diagonal element of the identify matrix corresponds to a spatial stream, which has zero interference with other elements of the identity matrix, including non-diagonal elements of the identity matrix that are forced to zero. As such, decomposing channel matrices and determining matrix inverses are useful in beamforming operations to reduce interference between the spatial streams.

When implemented by a MU-MIMO transmitter, ideally each client device receiving the beamformed spatial streams will see no interference from other spatial streams transmitted to other devices. In particular, inter-stream interference is reduced when a zero forcing precoder is able to successfully resolve matrix inverses and identity matrices for precoding each signal transmitted to the client devices. In some aspects, the apparatuses and techniques for matrix compensation described herein prevent rank deficiency and improve performance of a zero forcing precoder by effectively reducing dynamic ranges associated with complex matrix operations performed by the precoder. By so doing, bit-width of a fixed-point implementation may be reduced by approximately 30 percent and packet-error rate can be improved by two decibels for typical MU-MIMO channels and modulation and coding schemes (MCS).

The following discussion describes an operating environment, techniques that may be employed in the operating environment, and a System-on-Chip (SoC) in which components of the operating environment can be embodied. In the context of the present disclosure, reference is made to the operating environment by way of example only.

Operating Environment

FIG. 1 illustrates an example of an operating environment 100 having a host device 102 and client devices 104 that are capable of communicating data, packets, and/or frames over a wireless connection 106, such as a wireless-local-area network (WLAN). The WLAN may operate in accordance with various Institute of Electronics and Electrical Engineers (IEEE) 802.11 standards that may include 802.11ac, 802.11ad, 802.11ax, 802.11ay, and the like. Alternately or additionally, the wireless connection 106 or other wireless connections of the devices may be implemented as a personal area network (PAN), peer-to-peer network, mesh network, or cellular network, such as a 3rd Generation Partnership Project Long-Term Evolution (3GPP LTE) network.

In this example, the host device 102 is embodied as an access point that is capable of providing and managing a wireless network that includes the wireless connection 106. In other cases, the host device 102 may include or be embodied as a base station, enhanced node base station, wireless router, broadband router, modem device, or other network administration device. The client devices 104 of the example environment 100 include a smart-phone 108, tablet computer 110, laptop computer 112, and set-top box 114. Although not shown, other configurations of the client devices 104 are also contemplated, such as a desktop computer, a server, wearable smart-device, television, content-streaming device, high-definition multimedia interface (HDMI) media stick, mobile-internet device (MID), a network-attached-storage (NAS) drive, mobile gaming console, and so on.

Generally, the host device 102 provides connectivity to the Internet, other networks, or networked-resources through a backhaul link (not shown), which may be either wired or wireless (e.g., a T1 line, fiber optic link, broadband cable network, intranet, a wireless-wide-area network). The backhaul link may include or connect with data networks operated by an internet service provider, such as a digital subscriber line or broadband cable provider and may interface with the host device 102 via an appropriately configured modem (not shown). While associated with the host device 102 via the wireless connection 106, the smart-phone 108, tablet computer 110, laptop computer 112, or set-top box 114 may access the Internet or other networks for which host device 102 acts as a gateway.

The host device 102 includes a processor 116 configured to execute processor-executable instructions and computer-readable storage media 118 (CRM 118). In some cases, the processor 116 is implemented as an application processor or baseband processor to manage operation and connectivity of the host device 102. The CRM 118 of the host device 102 may include any suitable type and/or combination of storage media, such as read-only memory (ROM), random access memory (RAM), or Flash memory. The CRM 118 may store firmware, an operating system, or applications of the host device 102 as instructions that are executed by the processor 116 to implement various functionalities of the host device 102. In this example, a channel sounder 120, a precoder 122 that includes a matrix compensator 124, and feedback matrices 126 are embodied on the CRM 118 of the host device 102.

The channel sounder 120, precoder 122, and matrix compensator 124 of the host device 102 may be implemented to perform various functions associated with wireless communication. For example, the precoder 122 may be implemented as a zero forcing precoder for configuring multiple spatial streams for transmission to multiple respective devices in a MU-MIMO network environment. In some cases, the channel sounder 120 constructs and transmits channel sounding packets or frames to other wireless devices. The precoder 122 may separate data of the host device 102 into one or more spatial streams prior to transmission. The matrix compensator 124 can compensate various matrices during matrix inversion or decomposition operations to prevent rank deficiency issues and improve performance of the precoder 122. The feedback matrices 126, which may be generated based on the sounding packets or frames, can be used to generate steering matrices for beamforming spatial streams of data to the client devices 104. The implementations and uses of these entities vary, and are described throughout the disclosure.

The host device 102 also includes a transmitter 128, receiver 130, and antennas 132 for providing a wireless network, communicating with the client devices 104, or communicating other wirelessly-enabled devices. The transmitter 128 or receiver 130 may include any suitable number of respective communication paths (e.g., transmit or receive chains) to support transmission or reception of multiple spatial streams of data. Although not shown, radio frequency (RF) front-end circuitry of the host device 102 can couple or connect the transmitter 128 or receiver 130 to the antennas 132 to facilitate various types of wireless communication. The antennas 132 of the host device 102 may include an array of multiple antennas that are configured similar to or differently from each other.

Each of client devices 104 includes a processor 134 and computer-readable storage media 136 (CRM 136). The processor 134 can be any suitable type of processor, either single-core or multi-core, for executing instructions or code associated with applications and/or an operating system of the client device 104. The CRM 136 may include any type and/or combination of suitable storage media, such as RAM, non-volatile RAM (NVRAM), ROM, or Flash memory useful to store data of applications and/or an operating system of the client device 104. In this example, a feedback matrix generator 138 and channel estimator 140 of the client device 104 are also embodied on the CRM 136. Generally, the feedback matrix generator 138 may use the channel estimator 140 to provide or calculate, based on sounding frames, feedback matrices to facilitate beamforming operations. The implementations and uses of these entities vary, and are described throughout the disclosure.

The client devices 104 also include a transmitter 142, receiver 144, and antennas 146 for communicating with the host device 102 or other wirelessly-enabled devices. Although shown as separate entities, the transmitter 142 and receiver 144 may be implemented in combination as a transceiver component that supports both transmit and receive functionalities. The transmitter 142 or receiver 144 may include any suitable number of respective communication paths (e.g., transmit or receive chains) to support transmission or reception of multiple spatial streams of data. Front-end circuitry (not shown) of the client device 104 may couple or connect the transmitter 142 or receiver 144 to the antennas 146 to facilitate various types of wireless communication. The antennas 146 may include an array of multiple antennas that are configured similar to or differently from each other.

Figure 2:
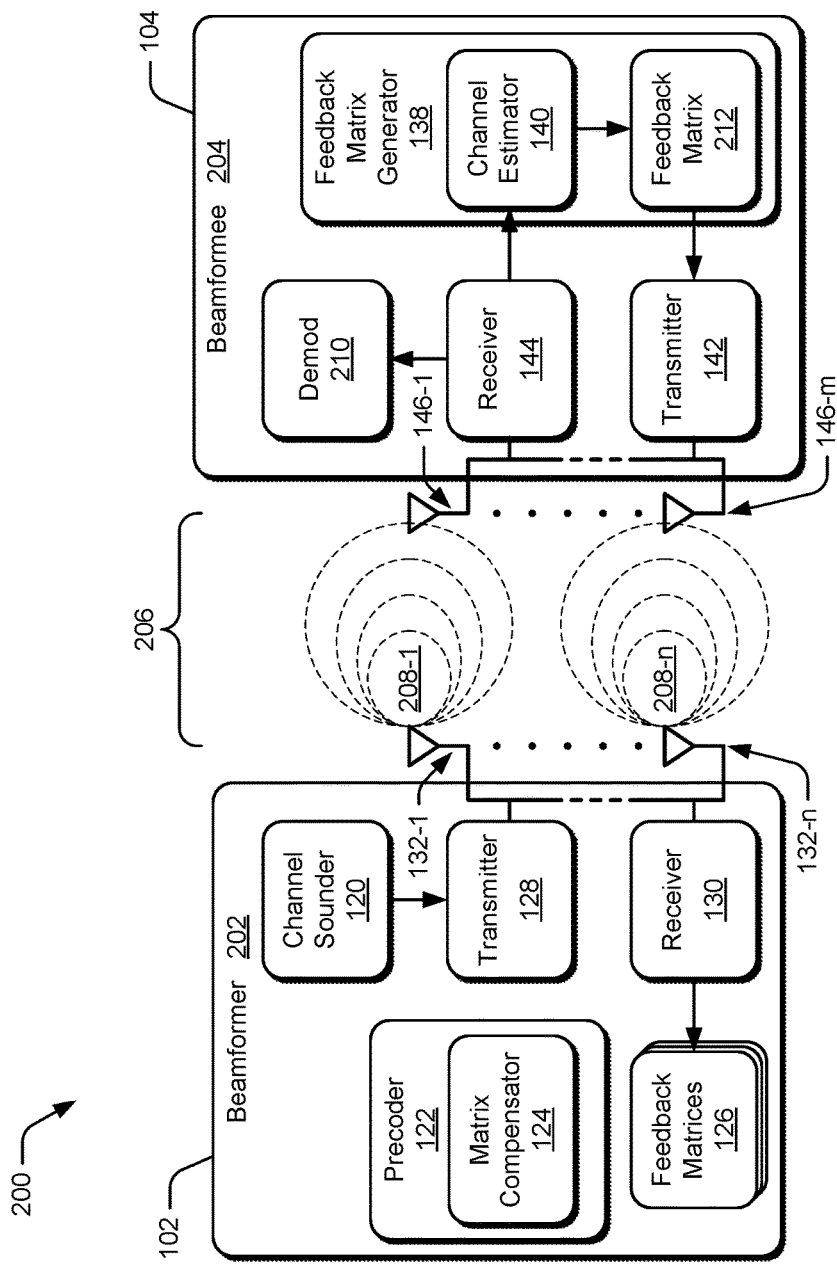
FIG. 2 illustrates example configurations of the devices of FIG. 1 that are implemented as respective beamformer and beamformee devices.

FIG. 2 illustrates example configurations of a host device 102 and client device 104 in accordance with one or more aspects generally at 200. In this example, the host device 102 and client device 104 are configured as a beamformer 202 and beamformee 204, respectively. Additionally, although described with reference to and shown as communication between two devices, aspects described herein can be implemented to support MU-MIMO communication in which the beamformer 202 concurrently transmits spatial streams to different respective client devices. Alternately or additionally, components of a beamformer 202 may also be embodied on a client device 104, such as to support generation of steering matrices or other beamforming operations.

Generally, the beamformer 202 and the beamformee 204 communicate via channel 206 of a wireless medium, such as air, the atmosphere, or other media through which electromagnetic (EM) waves propagate. A channel 206 between the beamformer 202 and the beamformee 204 (e.g., one of the client devices 104) may be characterized by information that describes conditions or a state of the channel In some cases, this channel state information (CSI) is useful to adjust or refine transmission parameters of signals transmitted through the channel 206 to receiving devices. To determine the conditions or state of the channel 206, the beamformer 202 and beamformee 204 may work together to implement channel sounding operations by which the channel 206 is characterized (e.g., measured) prior to the transmission of beamformed spatial streams (e.g., signal or data streams).

As part of characterizing the channel 206, a channel sounder 120 of the beamformer 202 may construct sounding frames 208, such as null data packet (NDP) frames, for transmission by the transmitter 128 of the beamformer 202. In some cases, the channel sounder 120 constructs a number of sounding frames 208-1 through 208-$n$ that correspond to a number of antennas 132-1 through 132-$n$ of the beamformer 202 or transmitting device. The channel sounder 120 may also construct announcement frames, such as NDP announcement frame, that identify an intended recipient device for channel sounding operations or a format of the sounding frames to follow. For example, a NDP announcement frame may specify feedback dimensions for a target device, a type of feedback requested, and the like. Potential beamformees 204 within range of the NDP announcement frame my respond with acknowledgement or defer channel access while other devices participate in the channel sounding operations.

As shown in FIG. 2, the channel sounder 120 can transmit, via the transmitter 128, the sounding frames 208-1 through 208-$n$. In some cases, each of the sounding frames 208-1 through 208-$n$ is transmitted by a respective one of the antennas 132-1 through 132-$n$ into the channel 206 and to the beamformee 204 and/or other beamformees 204 within range. Across the channel 206 of the wireless medium, the beamformee 204 receives one or more of the sounding frames 208-1 through 208-$n$ that have been affected by conditions of the channel 206, such as distance, fading, multipath reflections, and the like. In some cases, the receiver 144 receives or detects each of the sounding frames 208-1 through 208-$n$ at the antennas 146-1 through 146-$m$ of the beamformee 204. Thus, the beamformee 204 can obtain channel information (e.g., channel response) about respective signal paths between each antenna 132 that transmits (e.g., transmit antenna) a sounding frame 208 and each of the antennas 146-1 through 146-$m$ at which the sounding frame is received (e.g., receive antenna).

Generally, frames or packets received by the receiver 144 can be sent to a demodulator 210 for demodulation and decoding, or to the feedback matrix generator 138. During channel sounding, the channel estimator 140 of the beamformee 204 can analyze the received sounding frames 208 to build a model of conditions or state of the channel 206. For example, the channel estimator 140 can analyze long training fields (LTFs) of the sounding frames 208 to provide state information for the channel 206. As noted, sounding frames 208 transmitted by each antenna 132-1 through 132-$n$ may be received by some or all of the antennas 146-1 through 146-$m$ of the beamformee 204. Accordingly, the channel estimator 140 may construct a feedback matrix 212 of channel state information for the channel 206, which may be referred to as a feedback matrix V. The feedback matrix 212 may be any suitable size, such as a 4×1 matrix, a 4×2 matrix, a 4×3 matrix, and so on. In some cases, the feedback matrix is stored in a buffer (e.g., a V buffer) and compressed to conserve storage space or transmission bandwidth.

After the feedback matrix generator 138 uses the channel estimator 140 to generate the feedback matrix 212 (e.g., feedback matrix V), the feedback matrix 212 can be sent via the transmitter 142 to the beamformer 202. The beamformee 204 may also compress the feedback matrix of CSI, which can be stored locally or transmitted to the beamformer 202 for use in generating steering matrices. Once received, the beamformer 202 may store the feedback matrix 212 (or compressed feedback matrix) with other received or determined feedback matrices 126 (e.g., in a buffer) at the beamformee 204. The feedback matrix 212, or others of the feedback matrices 126, can then be accessed by the beamformer 202 (e.g., the precoder 122) for use in beamforming transmissions through the channel 206.

Figure 3:
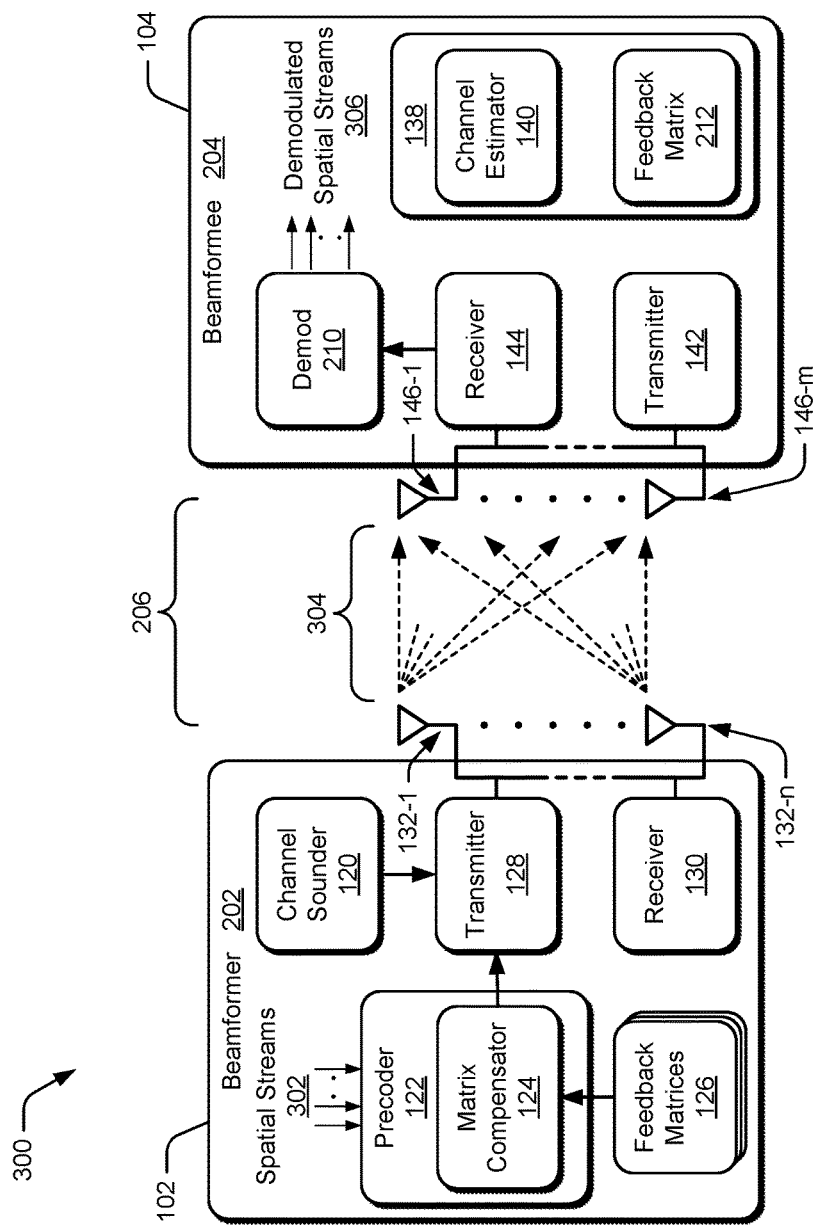
FIG. 3 illustrates other example configurations of the devices of FIG. 1 that are implemented as respective beamformer and beamformee devices.

By way of example, consider FIG. 3 which illustrates the beamformer 202 using feedback matrices to implement transmit beamforming (TxBF) operations or zero forced transmit (TxZF) operations to the beamformee 204. Here, the beamformer 202 uses the feedback matrices 126 (e.g., compressed V matrix) received from the beamformee 204 and other beamformees (e.g., client devices 104) to generate a steering matrix Q for beamforming spatial streams to the beamformee devices 204. As described herein, the steering matrix may be calculated based on an identity matrix or a zero forced matrix (e.g., non-diagonal values set to zero) such that interference between spatial streams transmitted to multiple beamformees is minimized or zeroed out.

With reference to FIG. 3, in order to transmit spatial streams of data 302 (spatial streams 302) to the beamformee 204 and other beamformees (not shown), the precoder 122 accesses the feedback matrices 126 received from the beamformees. Based on the feedback matrices 126, the precoder 122 may form a channel matrix for the channel 206 between the beamformer 202 and beamformee 204. The precoder 122 can then generate a channel covariance matrix, which is decomposed into an Eigen value matrix. In some aspects, the matrix compensator 124 compensates the Eigen value matrix or a channel covariance matrix to prevent rank deficiency. The implementations and uses of the precoder 122 and matrix compensator vary, and are described throughout the disclosure.

Based on the Eigen value matrix, the precoder 122 may determine a steering matrix for precoding the spatial streams 302 for transmission. To do so, the precoder 122 may multiply the channel matrix by a compensated inverse matrix of the channel covariance matrix to provide the steering matrix for a MU-MIMO transmission (e.g., $Q_{MU}$). The precoder 122 can then precode the spatial streams 302 for transmission via the antennas 132-1 through 132-$n$. Unlike other types of transmissions, such as non-beamformed multiple-input multiple-output (MIMO) that may transmit one spatial stream per antenna, the precoded spatial streams 302 can be transmitted on multiple antennas (e.g., an antenna array). Based on the determined steering matrix, the spatial streams 302 can be pre-coded to the antennas such that phase offsets between the transmissions effectively direct or "steer" the transmission of the spatial streams 302 toward the beamformee 204. Precoding the transmissions with the steering matrix may also reduce interference between the spatial streams such a spatial stream received by one client device does not interfere with another spatial stream transmitted to another client device.

As shown in FIG. 3, beamformed transmissions 304 of the spatial streams 302 are transmitted via the antennas 132-1 through 132-$n$ of the beamformer 202. Due to the spatial mapping and pre-coding implemented by the beamformer 202, the beamformed transmissions 304 can be directionally steered toward the beamformee 204. Additionally, the respective phase shifts of the beamformed transmissions 304 contribute to constructive interference such that the beamformed transmissions 304 arrive at the beamformee 204 with maximum signal strength and destructively interfere to reduce interference from other beamformed transmissions (e.g., signal nulls). Thus, transmit beamforming may increase an effective range of the beamformer 202 and reduce inter-stream interference, which may enable the use of more data-intensive modulation and coding schemes (MCS) over extended ranges.

At the other end of the channel 206, the beamformee 204 receives the beamformed transmissions 304 via the antennas 146-1 through 146-$m$. The receiver 144 sends the received spatial streams to the demodulator 210 for demodulation and decoding to provide demodulated spatial streams 306 of the data for use by the beamformee 204. As noted, the example device configurations of FIGS. 2 and 3 are described in reference to MU-MIMO beamforming in which multiple spatial streams are transmitted to multiple respective client devices. In some cases, respective configurations of the beamformer 202 and beamformees may determine a number of spatial streams transmitted to each beamformee. For example, an access point capable of supporting six spatial streams may beamform two spatial streams of data to a first client device and four spatial streams to a second client device.

Techniques of Matrix Compensation

The following discussion describes techniques of matrix compensation, which may prevent rank deficiency or improve beamformer performance. These techniques can be implemented using any of the environments and entities described herein, such as the precoder 122, matrix compensator 124, or feedback matrices 126. These techniques include methods illustrated in FIGS. 4, 6, and 7, each of which is shown as a set of operations performed by one or more entities. These methods are not necessarily limited to the orders of operations shown. Rather, any of the operations may be repeated, skipped, substituted, or re-ordered to implement various aspects described herein. Further, these methods may be used in conjunction with one another, in whole or in part, whether performed by the same entity, separate entities, or any combination thereof. For example, the methods may be combined to implement primary and auxiliary compensation operations during decomposition and subsequent manipulation of channel matrices. In portions of the following discussion, reference will be made to operating environment 100 of FIG. 1 and entities of FIGS. 2 and 3 by way of example. Such reference is not to be taken as limiting described aspects to operating environment 100 but rather as illustrative of one of a variety of examples.

Figure 4:
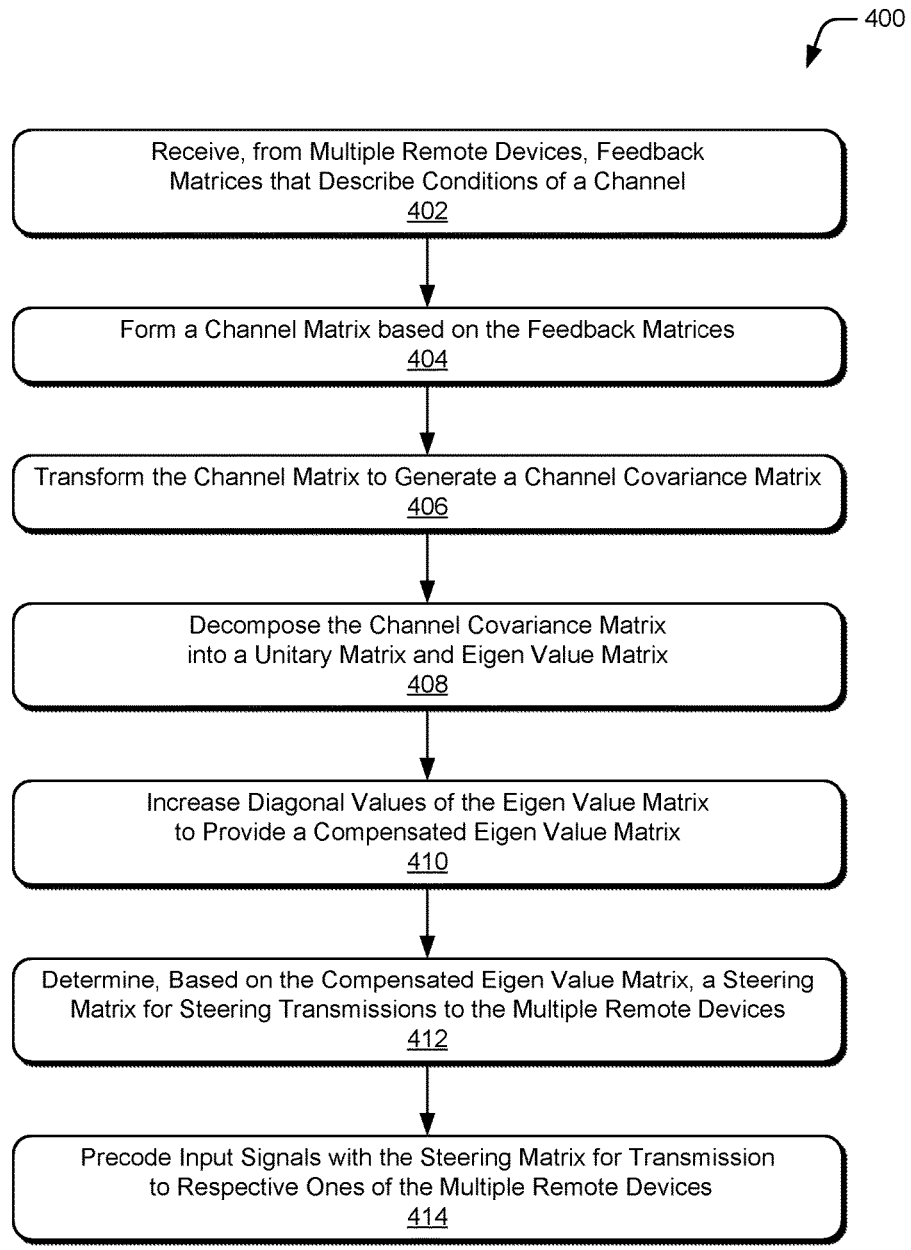
FIG. 4 illustrates an example method of matrix compensation to prevent rank deficiency.

FIG. 4 depicts an example method 400 of matrix compensation to prevent rank deficiency, including operations performed by the precoder 122 and matrix compensator 124.

At 402, feedback matrices are received from multiple remote devices. The feedback matrices may describe condition of a channel of a wireless medium through which beamforming is to be performed. In some cases, the feedback matrices are received from beamformees in response to a transmission of sounding frames by a beamformer. The feedback matrices may be received in accordance with any suitable type of network configuration or protocol, such as that supports MU-MIMO beamforming operations. Alternately or additionally, the feedback matrices may be configured with any suitable dimensions and/or may be compressed matrices to reduce network overhead.

Figure 5:
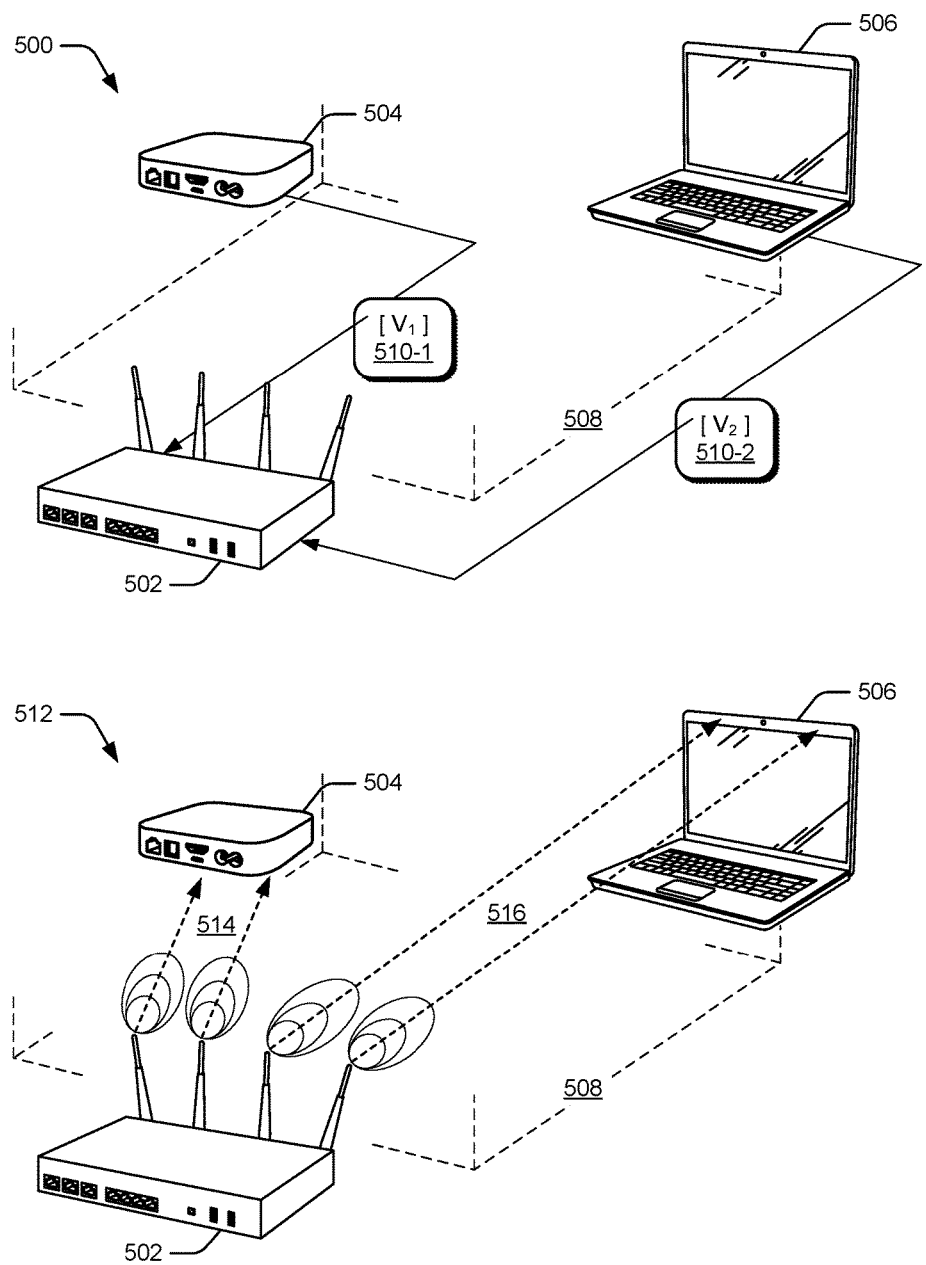
FIG. 5 illustrates an example of an access point communicating with client devices in accordance with one or more aspects.

By way of example, consider FIG. 5 which illustrates an example network environment 500 in which an access point 502 is configured as a MU-MIMO beamformer and a set-top box 504 and laptop 506 are configured as beamformees. Here, assume that the access point 502 has previously transmitted a series of sounding frames (not shown) to the set-top box 504 and laptop 506 in order to characterize a channel 508 of a the network environment 500 and conditions thereof. After the set-top box 504 and laptop 506 respectively estimate conditions of the channel 508, each client device transmits a respective compressed feedback matrix $V_1$ 510-1 and $V_2$ 510-2. The access point 502 receives the compressed feedback matrices $V_1$ 510-1 and $V_2$ 510-2 and stores the feedback matrices to a local memory or buffer that is accessible by a precoder 122 of the access point 502.

At 404, a channel matrix is formed based on the feedback matrices. The channel matrix may describe conditions or a state of the channel between the remote devices and the device at which the feedback matrices are received. For example, the channel matrix may describe multiple signal paths between a beamformer and multiple beamformees from which the feedback matrices are received. Continuing the ongoing example shown in FIG. 5, the precoder 122 of the access point 502 accesses the feedback matrices $V_1$ 510-1 and $V_2$ 510-2 and generates a channel matrix H for the MU-MIMO system as shown by equation 1 ($V_3$ optional). Here, assume that a number of spatial streams ($N_{SS\ Total}$) and a number to transmit antennas ($N_{TX}$) both equal four, though the channel matrix may be non-square in other instances.

Channel Matrix $H$ \hfill Equation 1

$$H = \begin{bmatrix} V_1 \\ V_2 \\ (V_3) \end{bmatrix}, \text{where a size of } H \text{ is } N_{SS\ Total} \times N_{TX}$$

At 406, the channel matrix is transformed to generate a channel covariance matrix. The channel covariance matrix may be generated by multiplying the channel matrix H with a Hermitian transform or conjugate transpose of the channel matrix H. In the context of the present example, the precoder 122 of the access point 102 can generate a channel covariance matrix B (e.g., beam matrix) by multiplying a Hermitian transform of the channel matrix H as shown in equation 2.

$$B = H^H H \quad \text{Equation 2:}$$
Channel Covariance Matrix B of size N×N

At 408, the channel covariance matrix is decomposed into a unitary matrix and an Eigen value matrix. The decomposition of the channel covariance matrix may also include a Hermitian transform or conjugate of the unitary matrix. Although described with reference to an Eigen value decomposition, aspects described herein may be implemented with other types of transforms or decompositions, such as singular value decompositions (SVD) of channel matrices. In some cases, the Eigen value matrix is configured or set value-wise similar to an identity matrix in which diagonal values are non-zero values and off-diagonal values are set or forced to zero values. Alternately or additionally, the channel covariance matrix may be decomposed into a diagonal matrix or other intermediate matrix with Eigen values as diagonal values organized in descending value. Continuing the ongoing example, the precoder 122 of the access point 502 decomposes the channel covariance matrix B into a unitary matrix U, an Eigen value matrix $\Lambda$, and a Hermitian transpose of the unitary matrix UH as shown in equation 3.

Eigen Values of Decomposed Channel \hfill Equation 3
Covariance Matrix $$B = U \cdot \Lambda \cdot U^H, \text{ where } \Lambda = \begin{bmatrix} \lambda_1 & 0 & \cdots & 0 \\ 0 & \lambda_2 & 0 & \vdots \\ \vdots & 0 & \ddots & 0 \\ 0 & \cdots & 0 & \lambda_N \end{bmatrix}$$

At 410, diagonal values of the Eigen value matrix are increased to provide a compensated Eigen value matrix. Compensating the Eigen value matrix may be effective to prevent rank deficiency issues when calculating steering matrices, such as during matrix inverse and vector estimation operations. Although described as an Eigen value matrix, any suitable matrix may be compensated, such as a modified channel covariance matrix or an intermediate matrix of an SVD. In some cases, the diagonal values of the Eigen value matrix are increased based on an average value of the diagonal values of the Eigen value matrix. In other cases, the diagonal values of the Eigen value matrix are increased based on an average value of off-diagonal value of the Eigen value matrix. Alternately or additionally, the diagonal values can be increased by a same value or different respective values, such as to reduce distortion of the Eigen value matrix.

In the context of the present example, the precoder 122 increases diagonal values λ of the Eigen value matrix Λ by a small value δ as shown in equation 4.

Loading Eigen Values λ of the Λ Matrix    Equation 4

$$B + \delta \cdot I = U \cdot (\Lambda + \delta \cdot I) \cdot U^H = \begin{bmatrix} \lambda_1 + \delta & 0 & \cdots & 0 \\ 0 & \lambda_2 + \delta & 0 & \vdots \\ \vdots & 0 & \ddots & 0 \\ 0 & \cdots & 0 & \lambda_N + \delta \end{bmatrix}$$

As noted with reference to operation 410 of method 400, the precoder 122 may determine an amount (δ) by which to increase the diagonal Eigen values based on an average of the diagonal values (e.g., $\lambda_{ii}$) as shown in equation 5 or an average of the off-diagonal values (e.g., $\lambda_{ij}$) as shown in equation 6.

δ Based on Average of Diagonal Terms for    Equation 5
Matrix Loading $$\delta = \alpha \cdot \frac{1}{N} \sum_{i=1}^{N} |b_{ii}|, \text{ where } \alpha \text{ is a small positive value}$$

$\delta = \alpha \cdot \Sigma_{i=1}^{N} \Sigma_{j=i+1}^{N} |b_{ij}| / \Sigma_{i=1}^{N} |b_{ii}|$,
where α is a small positive value    Equation 6:
δ Based on Average of Off-Diagonal Terms for Matrix Loading At 412, a steering matrix is determined based on the compensated Eigen value matrix. The steering matrix may be configured to beamform or steer transmissions of spatial streams to multiple remote devices. In some cases, the steering matrix is determined based on a modified channel covariance matrix or modified inverse of the channel covariance matrix that is compensated as described herein. The steering matrix may be configured to steer multiple spatial streams to multiple client devices in accordance with an MU-MIMO transmission scheme. Alternately or additionally, the steering matrix can be a zero forced matrix configured to reduce or eliminate interference between multiple transmitted spatial streams. Continuing the ongoing example, the precoder 122 of the access point 502 generates a steering matrix based on a modified channel covariance matrix formed from the compensated Eigen value matrix.

At 414, input signals are precoded with the steering matrix for transmission to respective ones of the multiple devices. The input signals may be precoded by a precoder or spatial mapper of a beamformer or host device. In some cases, a number of precoded spatial streams matches a number of transmit antennas available. In such cases, compensating the channel covariance matrix or Eigen value matrix may be effective to prevent rank deficiency issues that are common when a number of transmit antennas are fully utilized for beamforming a matching number of spatial streams.

Concluding the present example, the precoder 122 of the access point 502 precodes four spatial streams with the steering matrix generated based on the modified channel covariance matrix. As shown at 512, a first pair 514 of the precoded spatial streams are then transmitted to the set-top box 504 and a second pair 516 of the precoded spatial streams are transmitted to the laptop 506. As noted, using the steering matrix to precode the spatial streams may be effective to not only steer the spatial streams to an intended recipient device, but also to reduce interference among the spatial streams due to the use of zero forced precoding.

Figure 6:
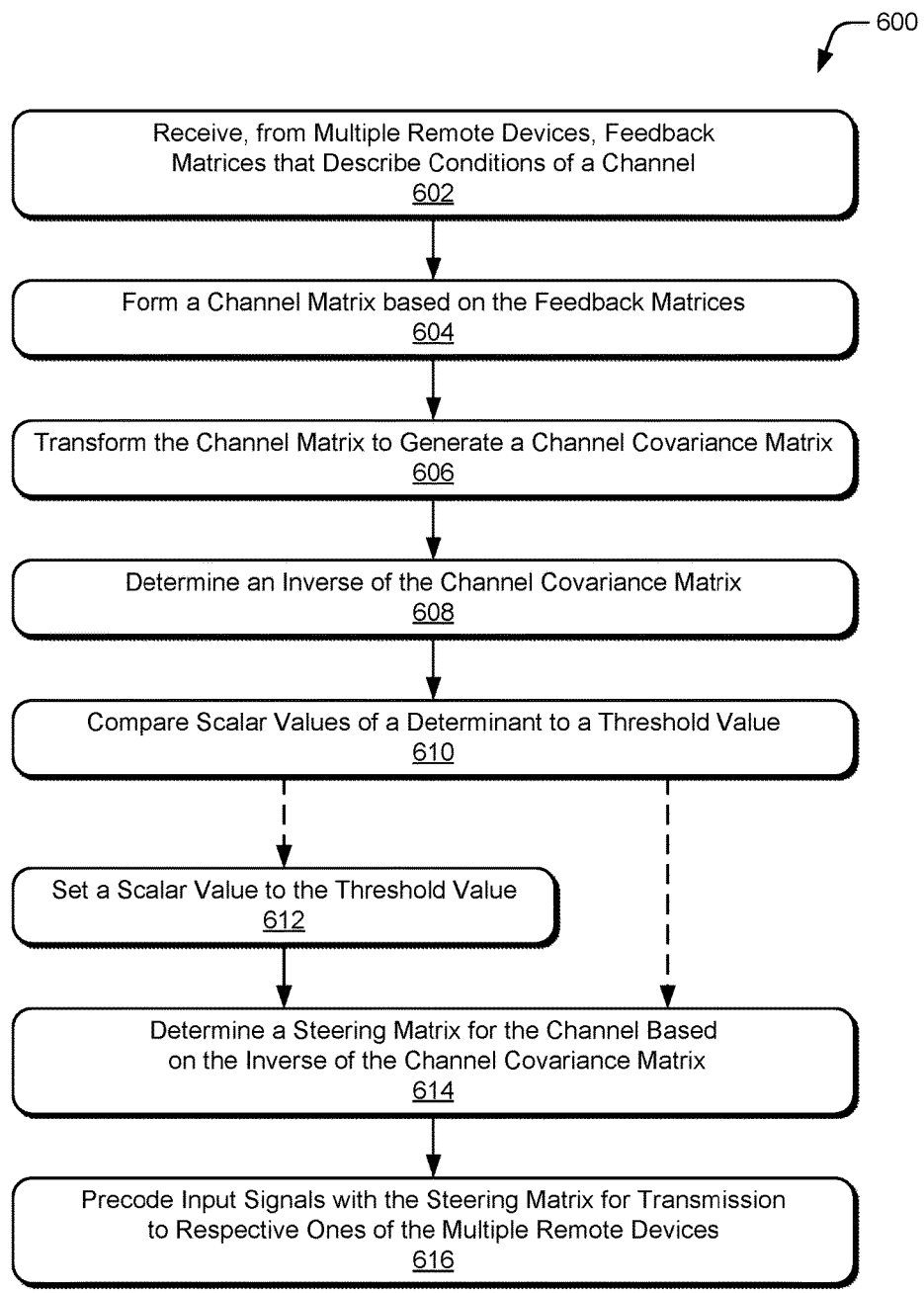
FIG. 6 depicts an example method for compensating a determinant of a sub-matrix of a channel covariance matrix.

FIG. 6 depicts an example method 600 for compensating a determinant of a sub-matrix of a channel covariance matrix, including operations performed by precoder 122 and matrix compensator 124.

At 602, feedback matrices are received from multiple remote devices. The feedback matrices may describe condition of a channel of a wireless medium through which beamforming is to be performed. In some cases, the feedback matrices are received from beamformees in response to a transmission of sounding frames by a beamformer. The feedback matrices may be received in accordance with any suitable type of network configuration or protocol, such as capable of implementing MU-MIMO beamforming operations. Alternately or additionally, the feedback matrices can be received in any suitable matrix dimension or as compressed matrices.

At 604, a channel matrix is formed based on the feedback matrices. The channel matrix may describe conditions or a state of the channel between the remote devices and the device at which the feedback matrices are received. For example, the channel matrix may describe multiple signal paths between a beamformer and multiple beamformees from which the feedback matrices are received.

At 606, the channel matrix is transformed to generate a channel covariance matrix. The channel covariance matrix may be generated by multiplying the channel matrix with a Hermitian transform or conjugate transpose of the channel matrix. In some cases, the channel covariance matrix is a square or symmetric matrix computed for a particular number of transmit antennas and a number of spatial streams to be transmitted.

At 608, an inverse of the channel covariance matrix is determined based on the channel covariance matrix. The inverse of the channel covariance matrix may be determined by a function or recursive algorithm of the matrix inversion. In some cases, an input to the inverse function is a symmetric channel covariance matrix of a particular dimension, which may be used to determine whether to implement an inversion operation or the recursive algorithm Alternately or additionally, a determinant of the channel covariance matrix and/or scalar values of sub-matrices of the channel covariance matrix can be determined. In such instances, the determinants (e.g., |B|) or the inverse of the determinants (e.g., 1/|B|, of small size sub-matrices) may be calculated in recursive algorithm of the inverse of the channel covariance matrix (or sub-matrix thereof).

At 610, scalar values of a determinant are compared with a threshold value. The scalar values of determinants or an inverse of the determinant (e.g., determinant of small size sub-matrices) can be compared with a threshold value. The threshold value may be configured to prevent matrices (or sub-matrices) with small scalar values from advancing to subsequent matrix operations in which the small values would cause rank deficiency or dynamic range (e.g., bit precision) issues. The threshold value may be predetermined before a start of matrix calculations or dynamically configured, such as through iterative back off until dynamic ranges issues are observed.

From operation 610, the method 600 may proceed to operation 612 if a scalar value is less than the threshold value or operation 614 if the scalar value meets the threshold value. At 612, the scalar value (e.g., a scalar value of the determinant) is set to the threshold value, which may be implemented as a minimum threshold value for the scalar value. In some cases, the scalar value may be set above the threshold value or the threshold value may be increased for subsequent comparison, such as when the method 600 is performed iteratively. After the scalar value is set based on the threshold value, the method 600 may proceed from operation 612 to operation 614.

At 614, a steering matrix is determined based on the inverse of the channel covariance matrix. In some aspects, a steering matrix (e.g., $Q_{MU}$) is determined by multiplying a Hermitian transform of the channel matrix (e.g., $H^H$) with the inverse of the channel covariance matrix (e.g., $B^{-1}$). The steering matrix may be configured to beamform or steer transmissions of spatial streams to multiple remote devices. In some cases, the steering matrix is determined based on a modified inverse of the channel covariance matrix, such as a matrix with a scalar value set to a threshold value. The steering matrix may be configured to steer multiple spatial streams to multiple client devices in accordance with an MU-MIMO transmission scheme. Alternately or additionally, the steering matrix can be a zero forced matrix configured to reduce or eliminate interference between multiple transmitted spatial streams.

At 616, input signals are precoded with the steering matrix for transmission to respective ones of the multiple devices. The input signals may be precoded by a precoder or spatial mapper of a beamformer or host device configured to transmit the spatial streams. In some cases, a number of precoded spatial streams matches a number of transmit antennas available. In such cases, compensating the scalar value or determinant of the inverse of the channel covariance matrix may be effective to prevent rank deficiency issues that are common when a number of transmit antennas are fully utilized for beamforming operations.

Figure 7:
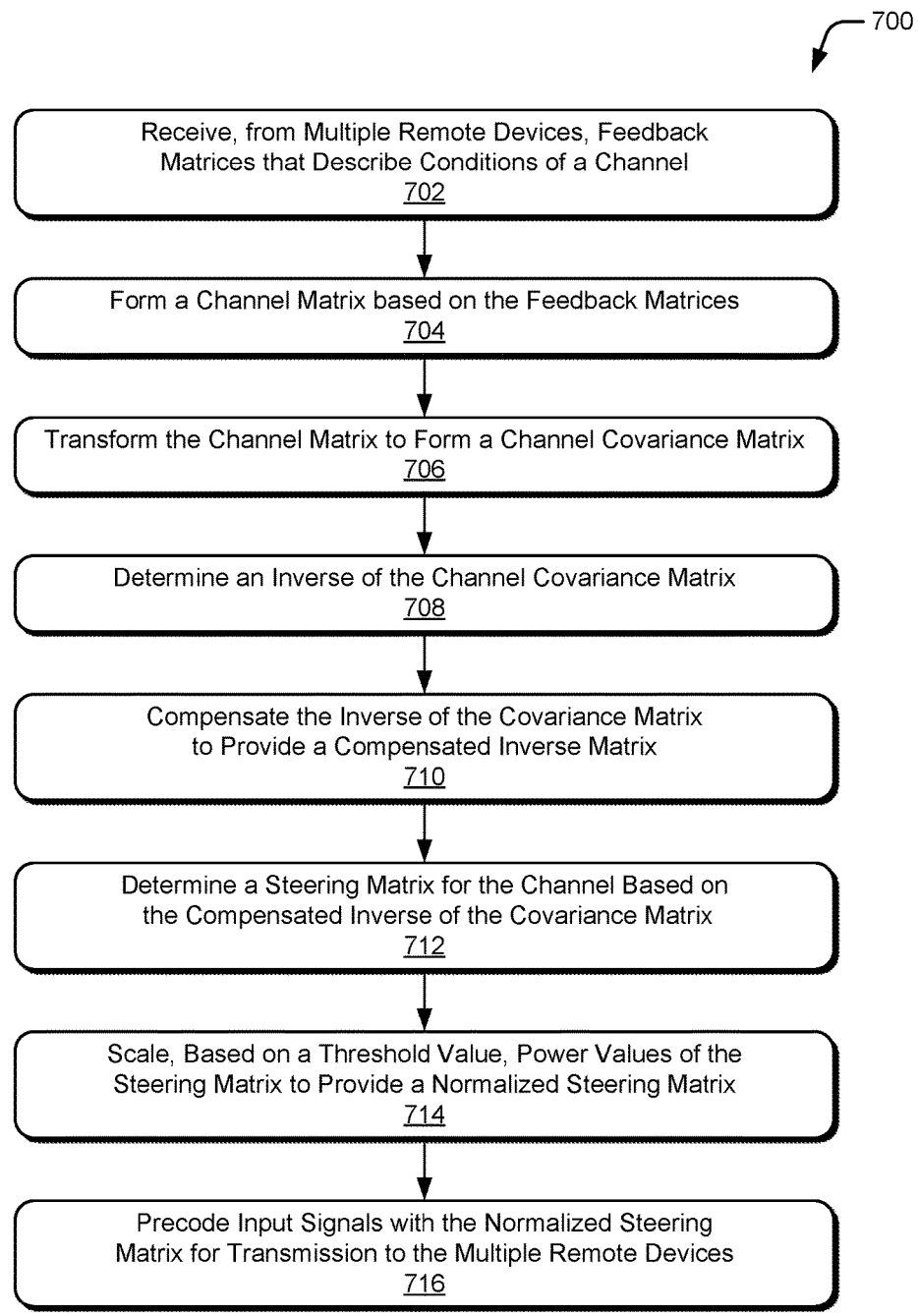
FIG. 7 depicts an example method for scaling power values of a steering matrix to normalize the steering matrix.

FIG. 7 depicts an example method 700 for scaling power values of a steering matrix to normalize the steering matrix, including operations performed by the precoder 122 and matrix compensator 124.

At 702, feedback matrices are received from multiple remote devices. The feedback matrices may describe condition of a channel of a wireless medium through which beamforming is to be performed. In some cases, the feedback matrices are received from beamformees in response to a transmission of sounding frames by a beamformer. The feedback matrices may be received in accordance with any suitable type of network configuration or protocol, such as one for implemented MU-MIMO beamforming operations.

At 704, a channel matrix is formed based on the feedback matrices. The channel matrix may describe conditions or a state of the channel between the remote devices and the device at which the feedback matrices are received. For example, the channel matrix may describe multiple signal paths between a beamformer and multiple beamformees from which the feedback matrices V are received as shown in equation 7.

Channel Matrix $H$      Equation 7

$$H = \begin{bmatrix} V_1 \\ V_2 \\ (V_3) \end{bmatrix}, \text{ where a size of } H \text{ is } N_{SS\ Total} \times N_{TX}$$

At 706, the channel matrix is transformed to generate a channel covariance matrix. The channel covariance matrix may be generated by multiplying the channel matrix with a Hermitian transform or conjugate transpose of the channel matrix. In some cases, the channel covariance matrix is a square or symmetric matrix computed for a particular number of transmit antennas and a total number of spatial streams to be transmitted (e.g., $N_{STS}$). Examples ways for determining values of a channel covariance matrix for various matrix elements and/or a number of transmit antennas (e.g., $N_{TX}$) are shown in equation 8.

Channel Covariance Matrix $B$      Equation 8

$B = H^H H$ form Hermitian Matrix $B$ of size $N_{STS} \times N_{STS}$ $$\text{Re}(b_{ij}) = \sum_{l=1}^{N_{TX}} [\text{Re}(h_{il})\text{Re}(h_{jl}) + \text{Im}(h_{il})\text{Im}(h_{jl})] \text{ and}$$

$$\text{Im}(b_{ij}) = \sum_{l=1}^{N_{TX}} [-\text{Re}(h_{il})\text{Re}(h_{jl}) + \text{Im}(h_{il})\text{Im}(h_{jl})]$$

when $j \leq i$ $\text{Re}(b_{ij}) = \text{Re}(b_{ji})$ and $\text{Im}(b_{ij}) = -\text{Im}(b_{ji})$ when $j > i$ At 708, an inverse of the channel covariance matrix is determined based on the channel covariance matrix. The inverse of the channel covariance matrix may be determined by a function or recursive algorithm of a precoder. In some cases, an input to the inverse function is a symmetric channel covariance matrix of a particular dimension, which may be used to determine whether to implement an inversion operation or the recursive algorithm for matrix inversion. Dimensions of the inverse of the channel covariance matrix, or a modified version thereof, may correspond to a total number of spatial stream to be transmitted (e.g., $B^{-1}$ of dimensions $N_{STS} \times N_{STS}$).

At 710, the inverse matrix of the channel covariance is compensated to provide a compensated inverse matrix. In some cases, the channel covariance matrix, an Eigen value matrix of the channel covariance matrix, or an inverse of the channel covariance matrix is compensated by diagonal loading. In some cases, the compensation values are determined based on an average of values of the channel covariance matrix. By way of example, a channel covariance matrix can be compensated as shown in equation 9.

For $i=1:N_{STS\ Total}$ $B_{ii}\mathrel{+}=\text{diagLoad};$ end;

diagLoad=0.02      Equation 9:
Diagonal Loading Channel Covariance Matrix B

Alternately or additionally, an inverse of the channel covariance matrix may be compensated based on a determinant of the channel covariance matrix. As another example, consider an matrix inverse function "matrixInverse (B, M, dim)" in which B is a symmetric input matrix of dimension dim and M is an output of the function that is the inverse of B (e.g., $B^{-1}$). This function may be implemented for different size matrices as shown in equations 10 for 2×2 matrices and equation 11 for larger matrices.

Inverse Matrix Function with Compensation for      Equation 10

2×2 Matrices

If Dim = 2, $M = \dfrac{1}{|B|}\begin{bmatrix} b_{22} & -b_{21} \\ -b_{12} & b_{11} \end{bmatrix}$, If $|B| < \text{Threshold}_B$, set $|B| = \text{Threshold}_B$ If $Dim>2$, use recusive matrix inverse algorithm to produce submatrices of $Dim=2$ and call matrix-Inverse(submatrices)      Equation 11:
Inverse Matrix Function for Matrices larger than Dim=2

At 712, a steering matrix is determined based on the compensated inverse of the channel covariance matrix. The steering matrix may be configured to beamform or steer transmissions of spatial streams to multiple remote devices. In some cases, the steering matrix is determined by multiplying a Hermitian transpose of the channel matrix with a compensated inverse of the channel covariance matrix (e.g., M). By way of example, consider equation 12 in which a steering matrix M is derived to accommodate a total number of transmit antennas (e.g., $N_{TX}$) and a total number of spatial streams (e.g., $N_{STS\_Total}$).

Steering Matrix Derivation    Equation 12

$$Q_{MU\_Temp} = H^H \cdot M \text{ of size } N_{TX} \times N_{STS\_TOTAL}$$

$$\text{Re}(q_{ij}) = \sum_{l=1}^{N_{STS\_TOTAL}} [\text{Re}(h_{li})\text{Re}(m_{lj}) + \text{Im}(h_{li})\text{Im}(m_{lj})] \text{ and}$$

$$\text{Im}(q_{ij}) = \sum_{l=1}^{N_{STS\_TOTAL}} [\text{Re}(h_{li})\text{Im}(m_{lj}) - \text{Re}(m_{lj})\text{Im}(h_{li})], \forall\, i, j$$

At 714, power values of the steering matrix are scaled based on a threshold value. A power scaling factor may be applied column-wise to the steering matrix to normalize power values of the steering matrix. In some cases, the power scaling factor may be determined based on a minimum power threshold or a number of transmit antennas to be used. In some cases, each column of the steering matrix is normalized for power as shown in equation 13.

For $j^{th}$ column of $Q_{MU\_Temp}$ denoted as $q^{(j)}$, compute column power as:

Column-wise Normalization of Steering Matrix    Equation 13

$$P^{(j)} = \sum_{l=1}^{N_{TX}} \text{Re}(q_{lj})^2 + \text{Im}(q_{lj})^2$$

if $P^{(j)} < \text{Threshold}_{Power}$, set $P^{(j)} = \text{Threshold}_{Power} = 2^{-4}$ alpha factor for scaling: $\alpha = \dfrac{1}{\sqrt{P^{(j)}}}$ beta factor for scaling: $\beta = \dfrac{1}{\sqrt{N_{TX}}}$, $\sqrt{4} = 2$ Scale columns of $Q_{MU\_Temp}$ as $q^{(j)} = q^{(j)} \cdot \alpha \cdot \beta$ At 716, input signals are precoded with the normalized steering matrix for transmission to respective ones of the multiple devices. The input signals may be precoded by a precoder or spatial mapper of a beamformer or host device configured to transmit the spatial streams. In some cases, a number of precoded spatial streams matches a number of transmit antennas available. In such cases, compensating the inverse of the channel covariance matrix may be effective to prevent rank deficiency issues that are common when a number of transmit antennas are fully utilized for beamforming operations. Alternately or additionally, scaling the power values of the steering matrix may improve transmitter performance when transmitting to multiple client devices.

System-on-Chip

Figure 8:
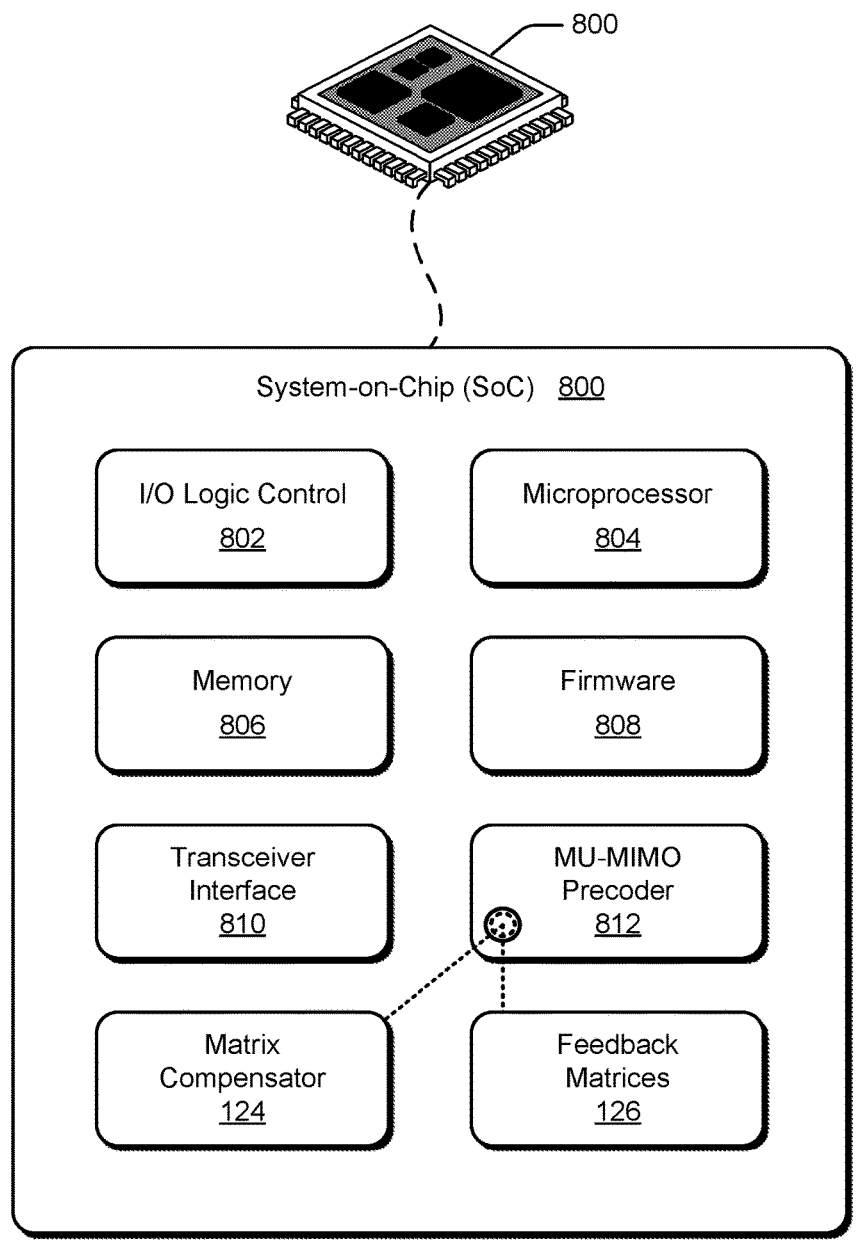
FIG. 8 illustrates an example System-on-Chip (SoC) environment for implementing aspects of matrix compensation to prevent rank deficiency.

FIG. 8 illustrates an exemplary System-on-Chip (SoC) 800 that can implement various aspects of matrix compensation to prevent rank deficiency. The SoC 800 can be implemented in any suitable device, such as a smart-phone, cellular phone, netbook, tablet computer, access point, wireless router, network-attached storage, camera, smart appliance, printer, a set-top box, or any other suitable type of device. Although described with reference to a SoC, the entities of FIG. 8 may also be implemented as an application-specific integrated-circuit (ASIC), chip set, communications controller, application-specific standard product (ASSP), digital signal processor (DSP), programmable SoC (PSoC), system-in-package (SiP), or field-programmable gate array (FPGA).

The SoC 800 can be integrated with electronic circuitry, a microprocessor, memory, input-output (I/O) logic control, communication interfaces, other hardware, firmware, and/or software useful to provide functionalities of a device, such as any of the devices listed herein. The SoC 800 can also include an integrated data bus (not shown) that couples the various components of the SoC for data communication between the components. The integrated data bus or other components of the SoC 800 may be exposed or accessed through an external port, such as a JTAG port. For example, components the SoC 800 may be configured or programmed (e.g., flashed) through the external port at different stages of manufacture, provisioning, or deployment.

In this example, the SoC 800 includes various components such as input-output (I/O) logic control 802 (e.g., to include electronic circuitry) and a microprocessor 804 (e.g., any of a microcontroller, processor core, application processor, or DSP). The SoC 800 also includes memory 806, which can be any type and/or combination of RAM, SRAM, DRAM, non-volatile memory, ROM, one-time programmable (OTP) memory, multiple-time programmable (MTP) memory, Flash memory, and/or other suitable electronic data storage. In the context of this disclosure, the memory 806 stores data, instructions, or other information via non-transitory signals, and does not include carrier waves or other transitory signals.

Alternately or additionally, SoC 800 may comprise a data interface (not shown) for accessing additional or expandable off-chip memory, such as external SRAM or Flash memory. SoC 800 may also include various applications, operating systems, software, and/or firmware, which can be embodied as processor-executable instructions maintained by memory 806 and executed by microprocessor 804. In some cases, the SoC 800 includes other communication interfaces, such as a transceiver interface 810 for controlling or communicating with components of a local or off-chip wireless transceiver. In this example, the SoC 800 also includes a multi-user MIMO precoder 812, which may be implemented similar to the precoder 122 as described with reference to FIG. 1. Generally, the MU-MIMO precoder 812 determines steering matrices and precodes signals for transmission to client devices in a multi-user network environment.

The SoC 800 also includes a matrix compensator 124 and feedback matrices 126 (e.g., a [V] buffer), which may be embodied as disparate or combined components, as described in relation to aspects presented herein. Examples of these components and/or entities, and their corresponding functionality, are described with reference to the respective components of the environment 100 shown in FIG. 1 and example device configurations shown in FIGS. 2 and 3. The matrix compensator 124 and feedback matrices 126, either in whole or part, can be implemented as processor-executable instructions maintained by the memory 806 and executed by the microprocessor 804 to implement various aspects and/or features described herein.

The matrix compensator 124, either independently or in combination with other entities, can be implemented with any suitable combination of components or circuitry to implement aspects described herein. For example, the matrix compensator 124 or a buffer storing the feedback matrices 126 may be implemented as part of a digital signal processor, arithmetic logic unit (ALU), matrix processor, spatial mapper, and the like. The matrix compensator 124 may also be provided integral with other entities of SoC 800, such as integrated with the microprocessor 804, a graphic processing unit, signal processing block, or vector processing block within the SoC 800. Alternately or additionally, the matrix compensator 124 and other components can be implemented as hardware, firmware, fixed logic circuitry, or any combination thereof.

Although the subject matter has been described in language specific to structural features and/or methodological operations, it is to be understood that the subject matter defined in the appended claims is not necessarily limited to the specific features or operations described herein, including orders in which they are performed.

What is claimed is:

1. A method for steering transmissions through a channel of wireless medium to multiple remote devices, the method comprising:
   receiving, by a hardware processor, via a transceiver, and from the multiple remote devices, feedback matrices that indicate conditions of the channel of wireless medium;
   forming, based the feedback matrices, a channel matrix that indicates the conditions of the channel;
   transforming the channel matrix to provide a channel covariance matrix;
   decomposing the channel covariance matrix into a unitary matrix and an Eigen value matrix;
   preventing rank deficiency when determining a steering matrix for steering transmissions through the channel to the multiple remote devices by at least increasing diagonal values of the Eigen value matrix to provide a compensated Eigen value matrix;
   determining, based on the compensated Eigen value matrix rather than the Eigen value matrix, the steering matrix for steering transmissions through the channel to the multiple remote devices; and
   steering, based on the steering matrix, the transmissions through the channel to the multiple remote devices.

2. The method as recited in claim 1, further comprising precoding signals with the steering matrix for transmission to respective ones of the multiple remote devices.

3. The method as recited in claim 2, further comprising transmitting, via an antenna array, the precoded signals to the respective ones of the multiple remote devices.

4. The method as recited in claim 1, wherein determining the steering matrix includes determining an inverse of the channel covariance matrix and the method further comprises:
   determining determinant scalar values of sub-matrices of the channel covariance matrix;
   comparing the determinant scalar values of the sub-matrices of the channel covariance matrix to a threshold value; and
   setting, responsive to at least one of the determinant scalar values being less than the threshold value, the at least one determinant scalar value to the threshold value to compensate the inverse of the channel covariance matrix.

5. The method as recited in claim 1, further comprising scaling, based on a power threshold, columns of the steering matrix to provide a normalized steering matrix.

6. The method as recited in claim 1, wherein the channel covariance matrix is decomposed into the unitary matrix, the Eigen value matrix, and a conjugate transpose of the unitary matrix.

7. The method as recited in claim 1, wherein the diagonal values of the Eigen value matrix are increased based on an average value of the diagonal values of the Eigen value matrix.

8. The method as recited in claim 1, wherein the diagonal values of the Eigen value matrix are increased based on an average value of off-diagonal values of the Eigen value matrix.

9. The method as recited in claim 1, wherein the method is implemented to communicate in accordance with one of the IEEE 802.11ac specification, the IEEE 802.11ad specification, the IEEE 802.11ax specification, or the IEEE 802.11ay specification.

10. An apparatus for wireless communication, the apparatus comprising:
    a receiver configured to receive data via a wireless medium;
    a transmitter configured to transmit other data via the wireless medium;
    a precoder configured to precode signals for transmission by the transmitter; and
    a matrix compensator configured to:
       receive, via the receiver and from multiple remote devices, feedback matrices that indicate conditions of a channel of the wireless medium;
       form, based the feedback matrices, a channel matrix that indicates the conditions of the channel;
       generate a channel covariance matrix based on the channel matrix;
       decompose the channel covariance matrix into a unitary matrix and an Eigen value matrix;
       prevent rank deficiency when determining a steering matrix for steering transmissions through the channel to the multiple remote devices by at least increasing diagonal values of the Eigen value matrix to provide a compensated Eigen value matrix;
       determine, based on the compensated Eigen value matrix rather than the Eigen value matrix, the steering matrix for steering transmissions to the multiple remote devices;
       precode, via the precoder, signals with the steering matrix to provide precoded signals; and
       transmit, via the transmitter and through the channel of the wireless medium, the precoded signals to respective ones of the multiple remote devices.

11. The apparatus as recited in claim 10, wherein to determine the steering matrix the matrix compensator is further configured to:
    determine an inverse of the channel covariance matrix that includes determinant scalar values of sub-matrices of the channel covariance matrix;
    compare the determinant scalar values of the sub-matrices of the channel covariance matrix to a threshold value; and
    set, responsive to at least one of the determinant scalar values being less than the threshold value, the at least one determinant scalar value to the threshold value effective to compensate the inverse of the channel covariance matrix.

12. The apparatus as recited in claim 10, wherein the matrix compensator is further configured to scale, based on a power threshold, columns of the steering matrix to provide a normalized steering matrix.

13. The apparatus as recited in claim 10, wherein the matrix compensator is further configured to:
increase the diagonal values of the Eigen value matrix based on an average value of the diagonal values of the Eigen value matrix; or
increase the diagonal values of the Eigen value matrix based on an average value of off-diagonal values of the Eigen value matrix.

14. The apparatus as recited in claim 10, wherein the matrix compensator is configured to:
increase each of the diagonal values of the Eigen value matrix by a same value to compensate the Eigen value matrix; or
increase each of the diagonal values of the Eigen value matrix by a different respective value to compensate the Eigen value matrix.

15. A System-on-Chip (SoC) comprising:
an interface for a transceiver of wireless communications;
a hardware-based processor;
a memory storing processor-executable instructions that, responsive to execution by the hardware-based processor, implement a matrix compensator to:
receive, via the transceiver and from multiple remote devices, feedback matrices that indicate conditions of a channel;
form, based the feedback matrices, a channel matrix that indicate the conditions of the channel;
generate a channel covariance matrix based on the channel matrix;
decompose the channel covariance matrix into a unitary matrix and an Eigen value matrix;
prevent rank deficiency when determining a steering matrix for steering transmissions through the channel to the multiple remote devices by at least increasing diagonal values of the Eigen value matrix to provide a compensated Eigen value matrix;
determine, based on the compensated Eigen value matrix rather than the Eigen value matrix, the steering matrix for steering transmissions through the channel to the multiple remote devices; and
steer, based on the steering matrix, the transmissions through the channel to the multiple remote devices.

16. The SoC as recited in claim 15, wherein the SoC further comprises a precoder configured to:
precode, based on the steering matrix, signals to provide precoded signals; and
cause, via the interface to the transceiver, transmission of the precoded signals through the channel to respective ones of the multiple remote devices.

17. The SoC as recited in claim 15, wherein to determine the steering matrix the matrix compensator is further configured to:
determine an inverse of the channel covariance matrix that includes determinant scalar values of sub-matrices of the channel covariance matrix;
compare the determinant scalar values of the sub-matrices of the channel covariance matrix to a threshold value; and
set, responsive to at least one of the determinant scalar values being less than the threshold value, the at least one determinant scalar value to the threshold value effective to compensate the inverse of the channel covariance matrix.

18. The SoC as recited in claim 15, wherein the matrix compensator is further configured to:
increase the diagonal values of the Eigen value matrix based on an average value of the diagonal values of the Eigen value matrix; or
increase the diagonal values of the Eigen value matrix based on an average value of off-diagonal values of the Eigen value matrix.

19. The SoC as recited in claim 15, wherein the SoC is embodied as or part of a modem processor, media access controller, wireless network interface, access point controller, or wireless communication chipset.

20. The SoC as recited in claim 15, wherein the instructions, responsive to execution by the hardware-based processor, further implement the matrix compensator to prevent rank deficiency when determining the steering matrix by at least:
determining determinant scalar values of sub-matrices of the channel covariance matrix;
comparing the determinant scalar values of the sub-matrices of the channel covariance matrix to a threshold value; and
setting, responsive to at least one of the determinant scalar values being less than the threshold value, the at least one determinant scalar value to the threshold value to compensate the inverse of the channel covariance matrix.

* * * * *